United States Patent
Hotta et al.

(10) Patent No.: US 6,423,468 B1
(45) Date of Patent: Jul. 23, 2002

(54) LITHOGRAPHIC PRINTING PLATE PRECURSOR AND PROCESS FOR LITHOGRAPHY

(75) Inventors: Hisashi Hotta; Katsuyuki Teraoka, both of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/443,284

(22) Filed: Nov. 19, 1999

(30) Foreign Application Priority Data

Nov. 20, 1998 (JP) .......................................... 10-331220

(51) Int. Cl.$^7$ ................................................ G03F 7/09
(52) U.S. Cl. .................... 430/270.1; 430/19; 430/348; 430/944; 430/945; 101/458; 101/465
(58) Field of Search ................................ 430/19, 270.1, 430/302, 945, 348, 944, 964; 101/456, 465, 467, 458

(56) References Cited

U.S. PATENT DOCUMENTS

| | | | |
|---|---|---|---|
| 3,922,206 A | * 11/1975 | Thackray | 204/6 |
| 5,925,496 A | * 7/1999 | Ghosh et al. | 430/270.1 |
| 6,048,654 A | * 4/2000 | Nakayama et al. | 430/19 |
| 6,079,331 A | * 6/2000 | Koguchi et al. | 101/467 |
| 6,082,263 A | * 7/2000 | Koguchi et al. | 101/456 |
| 6,218,075 B1 | * 4/2001 | Kimura et al. | 430/276.1 |
| 2001/0042469 A1 | * 11/2001 | Vosseler | 101/401.1 |

FOREIGN PATENT DOCUMENTS

| | | |
|---|---|---|
| EP | 0 769 372 A | 4/1997 |
| EP | 911 154 A1 * | 4/1999 |
| EP | 0 911 155 A | 4/1999 |
| GB | 1 587 260 | 4/1981 |
| JP | 10 250027 A | 9/1998 |
| JP | 2001001657 A * | 1/2001 |

OTHER PUBLICATIONS

R. Wang et al., "Photogeneration of Highly Amphiphilic T102 Surfaces", Advanced Materials, De, Vch Verlagsgesellschaft, Weinheim, vol. 10, No. 2, Jan. 22, 1998, pp. 135–138.

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

Disclosed are a printing plate precursor having an anodized titanium film layer on a surface thereof; a process for lithography which comprises image-wise exposing the surface of the printing plate precursor to an actinic light, bringing the exposed surface into contact with a printing ink to form a printing surface where the image areas have received the ink, and using the resultant printing plate to conduct printing; and the process for lithography described above which further comprises cleaning the surface of the printing plate after completion of the printing to remove the remaining ink from the surface, subsequently heating the printing plate precursor at 80 to 500° C., and then repeatedly using the printing plate precursor.

5 Claims, No Drawings

LITHOGRAPHIC PRINTING PLATE PRECURSOR AND PROCESS FOR LITHOGRAPHY

FIELD OF THE INVENTION

The present invention relates to a novel lithographic printing plate precursor from which a printing plate for general printing, especially for lithography, can be produced with great ease, and to a printing process using the printing plate precursor. The present invention further relates to a lithographic printing plate precursor capable of image deletion/correction and of repeated regeneration and use, and to a printing process using the printing plate precursor.

BACKGROUND OF THE INVENTION

Lithography has especially been generally used because printing plates therefor can be easily produced as compared with other many printing processes, and is one off the current main printing means. This printing process is based on oil/water immiscibility. An oily material, i.e., an ink, is held selectively by the image areas, while a dampening water is held selectively by the nonimage areas. The inked printing plate is brought into contact with the surface to be printed, either directly or indirectly through an intermediate called a blanket, whereby the ink held on the image areas is transferred to the surface to accomplish printing.

A major technique of lithography employs a presensitized plate comprising an aluminum plate as a base and a diazo-sensitized layer formed thereon. In producing the presensitized plate, a surface of the aluminum plate serving as a base is subjected to graining, anodization, and other various steps to enhance ink-receiving ability and the ink repellency of nonimage areas, improve printing durability, and heighten the image fineness of the printing surface. An image to be printed is then formed on the thus-treated surface. Consequently, lithography has become satisfactory in printing durability, the image fineness of the printing surface, and other properties, besides having the advantage of ease of printing plate production.

However, with the spread of printed matter, there has been a desire for further simplification of lithography and many simplified printing techniques have been proposed.

A representative example thereof is a printing technique in which a printing plate is produced by the silver salt diffusion transfer process. This technique is disclosed, e.g., in U.S. Pat. No. 3,511,656 and JP-A-7-56351. (The term "JP-A" as used herein means an "unexamined published Japanese patent application".) An example of the lithographic printing plate based on this technique is Copyrapid, marketed by Agfa-Gevaert. This technique is in practical use as a simple printing process because an image to be transferred can be obtained through one step and the imaged plate as it is can be used as a printing plate since the image is oleophilic. However, this technique also necessitates the step of diffusion transfer development with an alkaline developing solution, although it is simple. There is hence a desire for a simpler printing process which does not necessitate the step of development with a developing solution.

Under these circumstances, processes for producing a simplified printing plate have been developed in which the step of development with an alkaline developing solution is not conducted after image-wise exposure to light. This simplified printing plate is also called "untreated printing plate" because the development step can be omitted. In this technical field, means based on various principles have been proposed so far, and most of these are based on, e.g., (1) image formation by image-wise exposing an image recording surface and thermally destroying the irradiated areas in the surface, (2) image formation by image-wise exposing a recording surface to make the irradiated areas oleophilic (heat-mode curing), (3) image formation by image-wise exposing a recording surface to make the irradiated areas oleophilic by light-mode curing, (4) to change surface properties by the photodecomposition of a diazo compound, and (5) heat-mode melt transfer in image areas.

Examples of such simplified lithographic techniques are disclosed in, e.g., U.S. Pat. Nos. 3,506,779, 3,549,733, 3,574,657, 3,739,033, 3,832,948, 3,945,318, 3,962,513, 3,964,389, 4,034,183, 4,081,572, 4,693,958, 4,731,317, 5,238,778, 5,353,705, 5,385,092, and 5,395,729 and European Patent 1,068.

Although these devices do not necessitate a developing solution in platemaking, they have one or more of the following drawbacks: the difference between oleophilic areas and hydrophilic areas is insufficient; the quality of printed images is hence poor; resolution is poor and a printing surface having excellent sharpness is difficult to obtain, the imaged printing surface has insufficient mechanical strength and is susceptible to marring; the insufficient mechanical strength necessitates formation of a protective film or another measure and this impairs the advantage of simplicity; and the printing plate has insufficient durability and cannot withstand long-term use. Namely, the mere omission of the step of alkali development impairs suitability for practical use. The strong desire for a method for easily producing a printing plate having the various is properties required for printing remains unsatisfied.

One method for producing the untreated ed printing plate is disclosed in JP-A-9-169098, which utilizes the phenomenon in which a zirconia ceramic becomes hydrophilic upon irradiation with light. However, the printing plate obtained by this method has insufficient discriminability between image areas and nonimage areas because zirconia has low light sensitivity and the photoconversion from hydrophobicity to hydrophilicity is insufficient.

If there is a means for easily regenerating a spent printing plate precursor, besides the above-described simplified printing methods which do not necessitate a developing solution, the means is advantageous from the two standpoints of cost reduction and the diminution of wastes. Although the practical value of the regeneration and reuse of spent printing plate precursors is influenced by the simplicity of regeneration operation, to simplify a regeneration operation is a subject which is highly difficult to accomplish and almost no investigations have so far been made thereon. The only investigation is disclosed in JP-A-9-169098, cited above, in which use is made of a zirconia ceramic which is a special material for printing plate precursors.

Titanium oxide also has been found to come to have a hydrophilic surface upon irradiation with light, and an application of this phenomenon to a simplified printing plate precursor has been proposed. In general, techniques for titanium film deposition are roughly divided into three groups, i.e., vapor-phase processes, liquid-phase processes, and solid-phase processes. Examples of the vapor-phase processes include vapor deposition, sputtering, and CVD. Examples of the liquid-phase processes include spin coating and dipping. Examples of the solid-phase processes include thermal spraying and a film deposition method based on a solid-phase reaction. Although the titanium oxide films obtained by these conventionally known methods show better image-forming properties than the printing plate precursors obtained by the prior art methods described hereinabove, a further improvement in discriminability between image areas and nonimage areas has been desired. Furthermore, improvements in the evenness of a titanium oxide film and in the rate of titanium oxide film deposition have also been desired.

SUMMARY OF THE INVENTION

An object of the present invention is to provide a lithographic printing plate precursor from which a printing plate having sufficiently intact discriminability between image areas and nonimage areas and attaining excellent image quality can be obtained through a simple platemaking process not necessitating an alkaline developing solution, and which can be used repeatedly. Another object of the present invention is to provide a process for printing.

The present inventors thought that a means was necessary for enhancing the above-described surface property of titanium oxide which changes with light and heat, i.e., the property by which the surface becomes hydrophilic upon irradiation with an actinic light and the hydrophilized surface recovers the original nature upon heating. The inventors have made various investigations on methods for improving the above surface property of titanium oxide and, as a result, the present invention has been completed.

The present invention provides the following.

1. A printing plate precursor having an anodized titanium film layer on a surface thereof.
2. The printing plate precursor as described in 1 above wherein the surface has been roughened.
3. The printing plate precursor as described in 1 or 2 above which is capable of image correction in such a manner that the surface of the printing plate precursor is image-wise exposed to light and the resultant latent image is partly erased by the action of heat.
4. A process for lithography which comprises image-wise exposing the surface of the printing plate precursor as described in any one of 1 to 3 above to an actinic light, bringing the exposed surface into contact with a printing ink to form a printing surface where the image areas have received the ink, and using the resultant printing plate to conduct printing.
5. The process for lithography as described in 4 above which comprises image-wise exposing the surface of the printing plate precursor to an actinic light, bringing the exposed surface into contact with a printing ink to form a printing surface where the image areas have received the ink, using the resultant printing plate to conduct printing, cleaning the surface of the printing plate after completion of the printing to remove the remaining ink from the surface, subsequently heating the printing plate precursor at 80 to 500° C., and then repeatedly conducting printing with the printing plate precursor.

The present invention is based on the finding that an anodized titanium film layer has such a property that the surface thereof becomes hydrophilic upon irradiation with an actinic light and the hydrophilized surface recovers the original nature by the action of heat. These two changes in surface property were applied to discrimination in ink receptivity and repellency to establish a technique for producing a lithographic printing plate and regenerating a spent printing plate. The surface property change by the action of light is more significant in anodized titanium metal films than in films formed from titanium oxide itself.

That property can be utilized in the following manner. A surface of anodized titanium metal which is originally oleophilic and receptive of printing inks is image-wise irradiated with an actinic light. As a result, the surface nature of the irradiated areas changes from oleophilic to hydrophilic and those areas hence become ink-repellent. Thus, a printing plate is obtained which as it is can be used in printing without undergoing development or a similar treatment. Namely, an anodized titanium film layer can be used as a printing plate precursor for producing an untreated printing plate.

The plate which has been used in printing is cleaned to remove the ink and then heated, upon which the surface recovers the original oleophilicity. Consequently, the plate can be used repeatedly. It is also possible to use the same principle to impart hydrophilic image areas with an actinic light and to erase part of the hydrophilic image areas by partly heating the plate surface. Furthermore, the erased areas or other areas can be selectively irradiated again with an actinic light. Thus, the modification/processing of the image to be printed can be conducted. For the heating, use may be made of local contact with a heat source, partial irradiation with infrared, a laser light having a high light-to-heat conversion efficiency, such as carbon dioxide laser light, etc.

It is well known that titanium oxide has light sensitivity and generates oxygen radicals upon irradiation with ultraviolet rays. However, the fact that a film obtained by anodizing a titanium metal surface has such a property that the surface hydrophilic/oleophilic nature thereof changes upon irradiation with an actinic light is a newly found phenomenon which has no relationship with the photoelectric charge generation and was unknown at the time when investigations were being made on the utilization of the light sensitivity of titanium oxide in electrophotography. It should be noted that to apply the surface property changes to lithography is a new technical idea. In addition, the property changes between hydrophilicity and oleophilicity which were found in a film obtained by anodizing a titanium metal surface are far larger than those in the conventionally known zirconia ceramic and are larger than those in titanium oxide films obtained, e.g., by vapor deposition. Therefore, an image in which the discriminability between hydrophilic areas And oleophilic areas is high can be formed.

DETAILED DESCRIPTION OF THE INVENTION

Modes for caring out the present invention will be explained below in detail.

Anodized Titanium Film
(Titanium Metal Sheet)

The titanium metal sheet a surface of which is to be anodized to give a lithographic printing plate precursor may be a titanium metal sheet obtained by an ordinary method. For example, a commercially available titanium metal product having a purity of from 99.5 to 99.9% can be used. Such a titanium metal product need not be further purified because the changes in surface property between hydrophilicity and oleophilicity are not considerably influenced by purity. Possible impurities in most cases are aluminum, copper, lead, iron, carbon, nitrogen, oxygen, etc., and purities on the ordinary level pose especially no problem.

However, a titanium product prepared by obtaining the titanium metal called sponge titanium from a titanium ore by magnesium reduction or another method and further purifying the same by, e.g., vacuum high-temperature purification can, of course, be used.

From the standpoint of improving mechanical properties and corrosion resistance, titanium is frequently used as alloys containing about 4 to 5% aluminum, vanadium, manganese, iron, chromium: molybdenum, etc. Such alloys also can be used in the present invention.

On the other hand, a titanium metal film (sheet) may be used which is obtained by forming a thin titanium metal layer on an appropriate base by a known method such as, e.g., vapor deposition, sputtering, or electroplating.

The thickness of the vapor-deposited titanium metal film (sheet) is preferably from 0.01 to 10 $\mu$m, more preferably from 0.05 to 1.0 $\mu$m. The upper limit thereof is most preferably 0.30 $\mu$m so as to prevent distorted light interference. Thicknesses thereof not less than 0.01 $\mu$m are advantageous from the standpoint of enabling the anodized sheet to be fully photoactivated.

(Method for Anodization)

The surface of the titanium sheet is anodized in the aqueous electrolyte solutions shown below.

(1) An aqueous solution containing at least one inorganic acid selected from sulfuric acid, phosphoric acid, nitric acid, boric acid, and the like.

(2) An aqueous solution containing the at least one inorganic acid and hydrogen peroxide.

(3) An aqueous solution containing the at least one in organic acid shown in (1) above an d at least one of the alkali metal salts and alkaline earth metal salts of those acids.

(4) An aqueous solution containing at least one organic acid selected from oxalic acid, tartaric acid, citric acid, acetic acid, lactic acid, succinic acid, glutamic acid, sulfosalicyclic acid, naphthalenedisulfonic acid, and the like.

(5) An aqueous solution containing at least one of the alkali metal salts and alkaline earth metal salts of the above organic acids.

(6) An aqueous solution containing at least one member selected from the hydroxides and water-soluble carbonates of sodium, potassium, calcium, lithium, and magnesium and from aqueous alkali solutions such as ammonium hydroxide solution.

(7) An aqueous solution containing at least one of glycerophosphoric acid and the alkali metal salts and alkaline earth metal salts thereof and preferably further containing at least one of acetic acid and the alkali metal salts and alkaline earth metal salts thereof.

(8) An aqueous solution containing, in combination, two or more of the solutes contained in solutions (1) to (7) above.

The concentrations of the above aqueous electrolyte solutions are suitably determined according to the kinds of the electrolytes. various conditions for anodization are selected according to the aqueous electrolyte solution selected. Appropriate anodization conditions generally include an electrolyte concentration of generally from 0.001 to 3 mol/L, preferably from 0.005 to 1 mol/L, a liquid temperature of generally from 5 to 70° C., preferably from 20 to 50° C., a current density of generally from 1 to 60 A/dm$^2$, preferably from 2 to 10 A/dm2, a voltage of generally from 1 to 500 V, preferably from 100 to 400 V, and an electrolysis period of generally from 10 seconds to 10 minutes, preferably from 1 to 5 minutes. Anodization conditions suitable for each of representative electrolyte solutions will be shown in the Examples.

The thickness of the film formed by anodization is generally about from 0.001 to 10 $\mu$m, preferably from 0.1 to 5.0 $\mu$m, more preferably from 0.3 to 1.0 $\mu$m.

In some cases, doping the anodized surface with a metal of some kind is effective in enhancing the property of changing in surface hydrophilicity upon light irradiation. A metal having a weak ionization tendency is suitable for the doping. It is therefore preferred to dope the surface layer with platinum, palladium, gold, silver, copper, nickel, iron, or cobalt. The is surface layer may be doped with two or more of these preferred metals.

(Pretreatment of the Titanium Sheet for Anodization)

The titanium sheet (thin layer), irrespective of whether it has a single-layer structure or is reinforced with a base, may be subjected to a surface roughening treatment prior to anodization. Surface roughening enables the surface to have enhanced water-holding properties after having been hydrophilized, and is hence effective in improving discriminability between image areas and nonimage areas. Prior to the surface roughening treatment, a degreasing treatment is conducted, according to need, for removing the rolling oil remaining on the surface with, e.g., a surfactant, organic solvent, or aqueous alkali solution.

The surface roughening treatment of the titanium sheet (thin layer) can be conducted by various methods. Examples thereof include a method in which the surface is mechanically roughened, a method in which the surface is roughened by electrochemical dissolution, and a method in which the surface is selectively dissolved away chemically. Such methods may be used alone or in combination of two or more thereof. For the mechanical method, use can be made of a known technique such as grinding with balls or by brushing, blasting, or buffing. The electrochemical roughening of the titanium metal surface can be accomplished by using a known technique for roughening aluminum metal surface, e.g., surface roughening in a hydrochloric or nitric acid solution as an electrolytic solution with application of an AC or DC current. As disclosed in JP-A-54-63902, a combination of the above two methods can be utilized. The chemical surface roughening can be conducted by immersing the metal in an aqueous solution of one or more alkaline salts selected from sodium hydroxide, sodium carbonate, sodium silicate, sodium pyrophosphate, and the like to etch the metal surface.

The titanium sheet whose surface has been thus roughened is subjected to the anodization described above. However, the surface roughening is not essential to the titanium sheet in the present invention.

Base

The printing plate precursor according to the present invention can be used in various constitutions with respect to the base.

Especially preferred is a constitution formed from a titanium metal sheet alone by using the sheet itself as a base and anodizing the surface thereof. The thickness of this titanium metal sheet is generally about from 0.1 to 0.6 mm, preferably from 0.15 to 0.4 mm, more preferably from 0.2 to 0.3 mm.

Also usable is a constitution in which titanium metal is not used as a base and which is produced by forming a thin sheet (thin layer) of titanium metal on a low-cost metal sheet capable of reinforcing the titanium metal sheet or on a flexible metal sheet and then anodizing the surface of the titanium metal. Preferred examples of the high-strength low-cost metal sheet or flexible metal sheet include sheets of metals such as aluminum, stainless steel, nickel, and copper. Such a base metal sheet and a titanium metal sheet may be bonded to each other, or a thin layer of titanium may be formed on such a base metal sheet by vapor deposition. However, the former method is economical and simple.

Furthermore, a thin titanium metal layer may be formed on a chemically stable, flexible base made of a plastic such as, e.g., a polyester or a cellulose ester. It is also possible to form a titanium metal layer on a base such as a waterproof paper, polyethylene-laminated paper, or polyethylene-impregnated paper.

Preferred examples of the plastic and paper base include papers laminated with polyethylene, polypropylene, or polystyrene, films of plastics such as cellulose diacetate, cellulose triacetate, cellulose propionate, cellulose butyrate, cellulose acetate butyrate, cellulose nitrate, polytethylene terephthalate), polyethylene, polystyrene, polypropylene, polycarbonates, and poly (vinyl acetal), and papers or plastic films coated with aluminum by laminating or vapor deposition.

Preferred of the above bases are polyester films and aluminum or SUS sheets, which are less apt to corrode on printing plates. Especially preferred are aluminum sheets, which have satisfactory dimensional stability and are relatively inexpensive. Suitable for use herein are a sheet of pure aluminum and a sheet of an alloy consisting of aluminum as the main component and a slight amount of one or more other elements. Also usable is a plastic film coated with aluminum by laminating or vapor deposition. Examples of the elements other than aluminum contained in the aluminum alloy include silicon, iron, manganese, copper, magnesium, chromium, zinc, bismuth, nickel, and titanium. The content of such other elements in the alloy is up to 10% by weight at the most. Although the aluminum especially suitable for use in the present invention is pure aluminum, an aluminum product containing a slight amount of other elements may be used because completely pure aluminum is difficult to produce due to the refining techniques. As described above, the aluminum sheet to be applied to the present invention need not have a specific composition, and a conventionally known aluminum sheet for general use may be suitably utilized.

In the case where a metal sheet is used as a base for a titanium sheet, the surface of the metal base may have been roughened by a known method. The surface roughening may be conducted by any of a, mechanical means, electrochemical means, and chemical etching means, or by a combination of two or more thereof. There are cases where the surface roughening enables the anodized titanium film formed thereon to have improved water-holding properties. A preferred metal base which has undergone surface roughening is an aluminum base.

When a metal base is used besides a titanium sheet, the thickness of the base is generally about from 0.06 to 0.6 mm, preferably from 0.1 to 0.4 $\mu$m, more preferably from 0.1 to 0.3 mm. The thickness of the thin titanium metal layer is generally about from 0.001 to 0.1 $\mu$m, preferably from 0.005 to 0.05 mm, more preferably from 0.01 to 0.05 mm.

Platemaking

The surface of the printing plate precursor comprising an anodized titanium sheet is originally oleophilic and ink-receptive. Upon image-wise exposure to an actinic light, however, the irradiated areas become hydrophilic and ink-repellent. Consequently, the image-wise exposed printing plate precursor is brought into contact with a lithographic printing ink to form a printing surface in which the. non-image areas hold a dampening water and the image areas have received the ink. The printing surface is brought into contact with a receiving surface to transfer the ink. Thus, printing is conducted.

The "changes between oleophilicity and hydrophilicity upon light irradiation", on which the present invention is based, occur considerably in an anodized titanium film. As the difference between image areas and nonimage areas in hydrophilicity or oleophilicity becomes larger, not only the discriminability between the two kinds of areas becomes higher and the printing surface becomes clearer, but the resultant printing plate has higher printing durability. The degree of difference in hydrophilicity or oleophilicity can be expressed in terms of contact angle with a waterdrop the higher the hydrophilicity, the more a waterdrop spreads and the smaller the contact angle. Conversely, a surface which repels waterdrops (i.e., which is water-repellent or oleophilic) has a large contact angle. Namely, th e printing plate precursor of the present invention, which has an anodized titanium film, originally has a large contact angle with water but, upon irradiation with an actinic light, comes to have a considerably reduced contact angle and to repel oleophilic inks. By utilizing this property, ink-holding areas corresponding to an image a and water-holding areas are formed oh the plate surface. This plate surface is brought into contact with an image-receiving sheet, e.g., paper, whereby the ink is transferred to the receiving surface.

(Light Irradiation)

The actinic light used for exciting the anodized titanium film in the present invention may be the light. emitted from any light source as long as the light has a wavelength within the range in which the film is photosensitive. Anatase and rutile titanium oxides have photosensitive ranges at wavelengths of 387 nm and shorter and at 413 nm and shorter, respectively. The anodized titanium film has a photosensitive range at similar wavelengths of 420 nm and shorter. Preferred light sources which can be used include a mercury lamp, tungsten halogen lamp, other metal halide lamps, xenon lamp, carbon arc lamp, and the like. A helium-cadmium laser having an excitation light oscillation wavelength of 325 nm and a water-cooled argon laser having an oscillation wavelength of from 351.1 to 363.8 nm can also be used. Furthermore, lasers which have been ascertained to show near-ultraviolet oscillation can be applied, such as a zinc sulfide laser having an oscillation wavelength of 330 nm, a zinc sulfide laser having an oscillation wavelength of 370 nm, and a zinc sulfide/cadmium laser having an oscillation wavelength of from 330 to 440 nm.

Also usable is an And:YAG laser having a wavelength of 1,064 nm. Especially preferred is a Q-switched Nd:YAG laser in which pumping is optically conducted with a krypton arc lamp by means of pulse oscillation. For forming an image on the anodized titanium film, it is preferred to irradiate the film using a laser having a peak output of 1,000 W or higher, preferably 2,000 W or higher.

Usable besides the above-enumerated light sources are semiconductor lasers such as GaAS, Gap, PbS, and PbSe lasers, excimer lasers such as ArF, KrF, XeCl, and XeF lasers, and a helium-neon laser.

Although the preferred intensity of the light with which the anodized titanium film is irradiated varies depending on the wavelength of the light, it is generally from 0.05 to 100 $J/cm^2$ preferably from 0.2 to 10 $J/cm^2$, more preferably from 0.5 to 5 $J/cm^2$, in terms of surface exposure intensity as determined before modulation caused by the image to be printed.

The light sensitivity described above differs in both nature and mechanism from that of a zirconia ceramic disclosed in JP-A-9-169098. With respect to the degree of sensitivity, for example, there is a description therein to the effect that the zirconia ceramic is irradiated with a 7 $W/\mu m^2$ laser light, which corresponds to 70 $J/cm^2$ when the laser light pulse duration is taken as 100 nanoseconds. Namely, the sensitivity of the zirconia ceramic is lower by at least one figure than that of the anodized titanium film. With respect to mechanism, the light sensitivity of the anodized titanium film is thought to be based on a photoreaction in which an oleophilic organic deposit is peeled off, although this mechanism has not been fully elucidated, and is different from the photoconversion mechanism in zirconia.

As described hereinabove, the anodized titanium film according to the present invention is capable of image correction or the like. Illustratively stated, the hydrophilized areas formed by image-wise exposure are partly erased (caused to recover oleophilicity) by heating, and the erased areas are irradiated with an actinic light again to conduct image correction. The thermal erasion may be conducted either by direct application of a thermal energy or by irradiation with a light having a high light-to-heat conversion efficiency. For example, use is made of local contact with a printing heater, e.g., the printing head of a thermal printer, partial irradiation with infrared rays, or a laser light having a high light-to-heat conversion efficiency, such as carbon dioxide laser light.

(Printing Step)

After the anodized titanium film surface has been image-wise exposed to light, the printing plate precursor as it is can be sent to a lithographic printing step without being developed.

The printing process of the present invention therefore has many advantages, including simplicity, over ordinary known lithographic techniques. Specifically, a chemical treatment with an alkaline developing solution is unnecessary as described above, and the wiping or brushing which usually follows the chemical treatment, is unnecessary. In addition, the printing plate precursor is free from the environmental burden imposed by the discharge of a waste developing solution.

The exposed a areas of the lithographic printing plate thus obtained have been sufficiently hydrophilized. If desired and necessary, however, the plate surface is post-treated with rinsing water, a rinsing liquid containing a surfactant or the like, or a desensitizing liquid containing gum arabic or a starch derivative. For the post-treatment in the case of using the image recording material of the present invention as a printing plate material, those treatments can be conducted in various combinations.

For example, use may be made of a method in which a burning conditioner is applied to the lithographic printing plate with a sponge or absorbent cotton impregnated with the liquid, a method in which the printing plate is dipped in a burning conditioner placed in a vat to apply the liquid, or a method in which a burning conditioner is applied with an automatic coater. Evenly spreading the applied liquid with a squeegee or squeegee roller after the coating gives preferred results. In general, the application amount of the burning conditioner is preferably from 0.03 to 0.8 $g/m^2$ (on a dry basis).

The lithographic printing plate obtained through the treatments described above is mounted on a lithographic press or the like and used to conduct printing on many sheets.

(Printing Plate Regeneration Step)

The step of regenerating the printing plate which has been used for printing will be described next.

The printing plate, after completion of printing, is cleaned with a hydrophobic petroleum solvent to remove the adherent ink. Usable solvents include aromatic hydrocarbons commercially available as printing ink solvents, such as, e.g., kerosine and Isopar. Also usable are benzol, toluol, xylol, acetone, methyl ethyl ketone, and mixtures of these solvents.

The printing plate from which the ink has been washed away is then subjected to a heat treatment, whereby the whole plate surface becomes evenly oleophilic and recovers the sensitivity to light irradiation. The heat treatment is conducted at a temperature of 80° C. or higher, preferably 100° C. or higher. Although there are no particular limitations on the upper limit of temperature, the treatment is conducted at 500° C. or lower from the standpoint of profitability concerning energy and apparatuses. It is a matter of course that the higher the temperature, the shorter the period required for the recovery of oleophilicity. More preferably, the heat treatment is conducted, for example, at 150° C. for 10 minutes or longer, at 200° C. for 1 minute or longer, or at 250° C. for 10 seconds or longer. Although a prolonged heat treatment period may be used without arousing any trouble, no advantage is brought about even when the heating is prolonged after the recovery of surface oleophilicity.

Any desired heating means can be used as the heat source for regeneration as long as it meets the temperature and time conditions specified above. Examples of the heating means include radiation heating in which the plate it directly irradiated with infrared rays, indirect infrared irradiation in which a heat ray absorbing sheet such as, e.g., a black carbon. paper, is placed in contact with the printing plate surface, insertion into a thermostatic air chamber,. heating by contact with a hot plate or another heated plate, and contact with a heated roller.

The regenerated printing plate precursor thus obtained from a spent printing plate is stored so as to avoid exposure to an actinic light, in preparation for the next printing operation.

Although how many times the printing plate precursor of the present invention can be regenerated has not been fully grasped, the number of possible repetitions of regeneration is at least 5. It is thought that the number thereof is probably restricted by an irremovable fouling substance adherent to the plate surface, a plate surface scar whose repair is impractical, a mechanical deformation of the plate, etc.

EXAMPLES

The present invention will be explained below in more detail by reference to Examples, but the invention should not be construed as being limited thereto.

Examples 1 to 8 and Comparative Example 1

In Examples 1 to 8, a commercially available titanium sheet (thickness, 0.2 mm) was anodized under various conditions to produce titanium printing plate precursors according to the present invention. Properties of the precursors were examined, and the results obtained are shown.

The anodization conditions in each of Examples 1 to 8 are shown in Table 1 with respect to electrolyte, electrolyte concentration, electrolyte temperature, current density, voltage, and electrolysis. period. An oxide film was thus formed by anodization on the titanium sheet in each Example.

In Comparative Example 1, an aluminum base (thickness, 0.2 mm) was placed in a vacuum deposition apparatus and heated to 200° C., and the apparatus was evacuated to $1.0 \times 10^{-6}$ Torr. Thereafter, titanium oxide was heated with electron beams under the conditions of an oxygen gas pressure of $1.5 \times 10^{-4}$ Torr to deposit a thin titanium oxide film having a thickness of 750 Å on the aluminum base. Thus, a sample was prepared.

Subsequently, two sheets each having dimensions of 400×400 mm were cut out of each of the samples obtained in the Examples and Comparative Example. One of the two sheets for each sample was subjected to a measurement of contact angle, in which the surface was irradiated with ultraviolet light under the following conditions.

Light source: high-pressure mercury lamp (100 W)

Irradiation energy: about 3 mW/cm$^2$ (wavelength: ≦400 nm)

Irradiation period: 5 minutes

Before and after the irradiation, the surface of each sheet was examined for contact angle with water using a contact angle meter (Type CA-12, manufactured by Kyowa Kaimen Kagaku K. K.).

The found values are shown in Table 1. In the column "Electrolytic solution" in Table 1, Li acetate, Na acetate, Mg acetate, and Sr acetate mean the lithium, sodium, magnesium, and strontium salts of acetic acid, respectively. Distilled water was used for the measurement. The contact angle in the area irradiated with ultraviolet light and that in the area which had not been irradiated were measured and compared. A surface having a small contact angle is hydrophilic, while a surface having a large contact angle is oleophilic. Consequently, a large difference is in contact angle between before and after irradiation means that the change from oleophilicity to hydrophilicity is large and hence that the discriminability between ink-receptive areas and ink-repellent areas in printing is high.

As shown in Table 1, the differences in contact angle caused by ultraviolet light irradiation in the samples of Examples 1 to 8 ranged from 44° to 60°. In contrast, the sample of Comparative Example 1, in which titanium oxide had been deposited by sputtering, had a difference in contact angel as small as 30°.

Illuminator Unilec URM-600 Type GH-60201X, manufactured by Ushio Electric Co., Ltd., at a light intensity of 9 mW/cm$^2$ for 2 minutes.

After the exposure, each printing plate precursor sample, without being subjected to any post-treatment, was mounted on a printing machine to conduct printing. The printing machine used was Haris Medium-octavo Single-color Printing Machine (manufactured by Haris K. K.), and the ink used was Goes-G (N) Black (manufactured by Dainippon Ink & Chemicals, Inc.). As a dampening water was used a mixture obtained by diluting dampening water EU-3 (manufactured by Fuji Photo Film Co., Ltd.) with water in a ratio of 1:100 and mixing the dilution with isopropanol in a ratio of 90:10 by volume. Printing was conducted on wood-free paper. As a result, a clear printed matter free from scumming was obtained with each of the printing plates of the Examples even after 1,000-sheet printing.

On the other hand, in the printed matters obtained with the printing plate of Comparative Example 1, scumming (nonimage areas having a reflection density of 0.08) was observed after 200 sheets had been printed.

Subsequently, the surface of each printing plate used for printing was carefully cleaned with a waste impregnated with printing ink cleaning fluid Dai Clean R (sold by Dainippon Ink & Chemicals, Inc.) to remove the ink. This plate was heated in a 150° C. oven for 10 minutes, subsequently allowed to cool to room temperature, and then examined for contact angle by the same method as the above. As a result, the contact angle in any part of the plate surface was within the range of ±4° based on the initial contact angle value for the unexposed plate. Namely, each plate recovered the initial oleophilic state.

Each plate in the above state was exposed with the same light source as in the first exposure (the printing illuminator

TABLE 1

| | Electrolytic solution | Temperature [° C.] | Current density [A/cm$^2$] | Voltage [V] | Electrolysis period [min] | Contact angle Before UV irradiation | Contact angle After UV irradiation |
|---|---|---|---|---|---|---|---|
| Example 1 | H$_4$SO$_4$ 0.3 mol/L | 30 | 5 | 120 | 1 | 70 | 10 |
| Example 2 | tartaric acid 0.1 mol/L | 25 | 3 | 120 | 25 | 71 | 13 |
| Example 3 | NaOH 0.2 mol/L | 30 | 3 | 20 | 5 | 73 | 15 |
| Example 4 | H$_3$PO$_4$ 0.3 mol/L | 20 | 3 | 200 | 4 | 70 | 21 |
| Example 5 | Na glycerophosphate 0.01 mol/L + Li acetate 0.15 mol/L | 40 | 5 | 350 | 4 | 68 | 24 |
| Example 6 | Na glycerophosphate 0.01 mol/L + Na acetate 0.13 mol/L | 40 | 5 | 350 | 4 | 71 | 24 |
| Example 7 | Na glycerophosphate 0.005 mol/L + Mg acetate 0.07 mol/L | 40 | 5 | 350 | 4 | 78 | 23 |
| Example 8 | Na glycerophosphate 0.005 mol/L + Sr acetate 0.09 mol/L | 40 | 5 | 350 | 4 | 78 | 20 |
| Comparative Example 1 | TiO$_2$ (sputtering) | | | | | 90 | 60 |

Thereafter, a lith film original bearing a positive image having 400 lines per inch was placed on the surface of the remaining one of the two cut sheets for each sample, having dimensions of 400×400 mm. A quartz glass plate was placed thereon to mechanically bring the original into close contact with the sample sheet. This assemblage was exposed with USIO Printing manufactured by Ushio Electric Co., Ltd.) at the same light intensity (9 mW/cm$^2$) for 2 minutes through a lith film bearing a positive image different from that in the first exposure. Thereafter, the surface of each plate was examined for contact angle by the same airborne waterdrop method as in the first measurement. As a result, in each of the Examples and Comparative Example, the contact angle in the exposed areas was within the range of ±4° based on the found value obtained in the first measurement given in Table 1, showing that each plate was satisfactory in the repeated recovery of hydrophilicity.

These plates each was subjected to 1,000-sheet lithographic printing using the same printing machine, printing ink, and dampening water as the above. As a result, all the printed matters, including the first and the final ones, obtained with each of the sample plates of Examples 1 to 8 were clear and no damage was observed in each printing plate. These printing plates were found to be repeatedly usable. On the other hand, the printed matters obtained with the sample plate of Comparative Example 1 were found to suffer scumming as in the first printing operation.

With respect to the sample plates of Examples 1 and 2, the above procedure was repeated five times. As a result, each plate underwent no change in light sensitivity, contact angle, the rate of thermal recovery of contact angle, etc.

Example 9

The same commercially available titanium sheet (thickness, 0.2 mm) as in Example 1 was used. In this Example, however, the titanium sheet was subjected to a surface roughening treatment prior to anodization in the following manner. The titanium sheet was subjected to graining with a nylon brush and an aqueous suspension of 400-mesh pumice powder, subsequently washed thoroughly with water, and then etched by immersion in 20 wt % aqueous sodium hydroxide solution at 60° C. for 1 minute. Thereafter, the titanium sheet was rinsed with running water and then cleaned with 30 wt % aqueous sulfuric acid solution at 60° C. for 1 minute. After this surface roughening treatment, the titanium sheet was anodized in the same manner as in Example 1. The sample thus obtained was cut into 400×400 mm, and this cut sheet was subjected to the following test. A lith film original bearing a positive image having 400 lines per inch was placed on the surface of the sample sheet. A quartz glass plate was placed thereon to mechanically bring the original into close contact with the sample sheet. This assemblage was exposed with USIO Printing Illuminator Unilec URM-600 Type GH-60201X, manufactured by Ushio Electric Co., Ltd., at a light intensity of 9 mW/cm$^2$ for 2 minutes.

After the exposure, the sample sheet, without being subjected to any post-treatment, was directly mounted on a printing machine to conduct printing. The printing machine used was Haris Medium-octavo Single-color Printing Machine (manufactured by Haris K. K.), and the ink used was Goes-G (N) Black (manufactured by Dainippon Ink & Chemicals, Inc.). As a dampening water was used a mixture obtained by diluting dampening water EU-3 (manufactured by Fuji Photo Film Co., Ltd.) with water in a ratio of 1:100 and mixing the dilution with isopropanol in a ratio of 90:10 by volume. Printing was conducted on wood-free paper. As a result, a clear printed matter free from scumming was obtained even after 3,000-sheet printing.

On the other hand, the exposed sample sheet was treated in the following manner. A treating fluid prepared by diluting gum GU-7 (manufactured by Fuji Photo Film Co., Ltd.) with water in a ratio of 1:1 was applied to the sample sheet with gum coater G800H (manufactured by Fuji Photo Film Co., Ltd.) and dried. The sample sheet thus treated was mounted on the printing machine to conduct printing in the same manner as the above. As a result, a clear printed matter free from scumming was obtained even after 4,000-sheet printing.

A comparison between the above results and those obtained in Example 1 shows that roughening the surface of the anodized titanium was effective in improving printing durability.

Example 10

The anodized sheet obtained in Example 1 was irradiated with Nd:YAG laser light. This Nd:YAG laser was a Q-switched laser of the type in which pumping was optically conducted with a krypton arc lamp and the spot size, i.e., beam diameter, was about 340 μm. The scanning speed was regulated to 50 mm/sec so as to enable solid imaging.

Specific conditions for laser irradiation are as follows.

Laser beam mode: single mode (TEM00)

Peak output: 1,300 W (1,000–8,000 W)

Average output: 1.0 W (0.1–20 W)

Pulse rate: 2.0 kHz (1.0–50 kHz)

Pulse duration: 0.12 μsec (0.1–0.2 μsec)

Spot diameter: 340 μm

Scanning speed: 50 mm/sec

The part in which an image had been formed by laser irradiation was examined for contact angle in the same manner as in Example 1. As a result, that part, in which the contact angle prior to the laser irradiation was 70°, came to have a contact angle of 10° through the laser irradiation. Thus, a large difference in contact angle was observed.

Furthermore, that part of this sample in which an image had been formed by Nd:YAG laser irradiation was directly irradiated using $CO_2$ laser marker LSS-S005 (10 W) (manufactured by Horiuchi Denki Seisaku-sho K. K.) at a speed of 100 and an output of 25%. As a result, the image could be erased and the contact angle returned to 70°.

The printing plate precursor of the present invention, which comprises a titanium sheet having an oxide film formed thereon by anodization, can give a printing surface only through image-wise exposure to an actinic light, without using a developing solution. Lithographic printing is possible with this printing plate while keeping the printing surface clear. The printing plate precursor used can be regenerated by heat treatment, and the regenerated plate can be repeatedly used.

What is claimed is:

1. A printing plate precursor having an anodized titanium film layer on a surface thereof and which is capable of image correction in such a manner that the surface of the printing plate precursor is image-wise exposed to light and the resultant latent image is partly erased by the action of heat.

2. The printing plate precursor of claim 1, wherein the surface has been roughened.

3. A process for lithography which comprises image-wise exposing a surface of a printing plate precursor having an anodized titanium film layer on a surface thereof to an actinic light, bringing the exposed surface into contact with a printing ink to form a printing surface where the image areas have received the ink, and using the resultant printing plate to conduct printing.

4. The process for lithography of claim 3, which comprises image-wise exposing the surface of the printing plate precursor to an actinic light, bringing the exposed surface into contact with a printing ink to form a printing surface where the image areas have received the ink, using the resultant printing plate to conduct printing, cleaning the surface of the printing plate after completion of the printing to remove the remaining ink from the surface, subsequently heating the printing plate precursor at 80 to 500° C., and then repeatedly conducting printing with the printing plate precursor.

5. The process for lithography of claim 3, wherein the surface has been roughened.

* * * * *